United States Patent
Okihara

(10) Patent No.: US 9,876,126 B2
(45) Date of Patent: Jan. 23, 2018

(54) SEMICONDUCTOR DEVICE AND SEMICONDUCTOR DEVICE MANUFACTURING METHOD

(71) Applicant: LAPIS SEMICONDUCTOR CO., LTD., Kanagawa (JP)

(72) Inventor: Masao Okihara, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 15/296,339

(22) Filed: Oct. 18, 2016

(65) Prior Publication Data

US 2017/0117421 A1 Apr. 27, 2017

(30) Foreign Application Priority Data

Oct. 23, 2015 (JP) .................................. 2015-209226

(51) Int. Cl.

| | |
|---|---|
| *H04N 5/335* | (2011.01) |
| *H01S 5/06* | (2006.01) |
| *H01L 33/50* | (2010.01) |
| *H01L 31/103* | (2006.01) |
| *H01L 31/0352* | (2006.01) |
| *H01L 31/0264* | (2006.01) |
| *H01L 31/0216* | (2014.01) |
| *G02B 5/28* | (2006.01) |

(Continued)

(52) U.S. Cl.
CPC ........ *H01L 31/02165* (2013.01); *G02B 5/283* (2013.01); *H01L 31/02019* (2013.01); *H01L 31/02164* (2013.01); *H01L 31/103* (2013.01); *H01L 31/1804* (2013.01)

(58) Field of Classification Search
CPC . H01L 31/18; H01L 27/144; H01L 31/02162; H01L 31/105
See application file for complete search history.

(56) References Cited

U.S. PATENT DOCUMENTS

2008/0111205 A1* 5/2008 Miura ................... H01L 31/105
257/440
2010/0084678 A1* 4/2010 Streubel .................. H01L 33/50
257/98

(Continued)

FOREIGN PATENT DOCUMENTS

| JP | 2008-251709 A | 10/2008 |
|---|---|---|
| JP | 2009-176835 A | 8/2009 |

(Continued)

OTHER PUBLICATIONS

15296339_foreign ref translation (WO 2012137539 A1).*

*Primary Examiner* — Kimberly Rizkallah
*Assistant Examiner* — Brian Turner
(74) *Attorney, Agent, or Firm* — Volentine & Whitt, PLLC

(57) ABSTRACT

A semiconductor device that includes: a pair of photoelectric transducers that output photocurrent that accords with an intensity of received light; and a first filter film that is provided to a light incidence side of one out of the pair of photoelectric transducers, that is configured by alternatingly stacking high refractive index layers and low refractive index layers having mutually different refractive indexes, and that transmits one out of either UV-A waves or UV-B waves included in ultraviolet rays with a higher transmittance than the other out of the UV-A waves and the UV-B waves.

14 Claims, 16 Drawing Sheets

(51) Int. Cl.
*H01L 31/02* (2006.01)
*H01L 31/18* (2006.01)

(56) References Cited

U.S. PATENT DOCUMENTS

| | | | |
|---|---|---|---|
| 2011/0204233 A1* | 8/2011 | Costello | G01S 7/4813 250/338.4 |
| 2012/0199826 A1* | 8/2012 | Nakahara | G01J 1/1626 257/43 |

FOREIGN PATENT DOCUMENTS

| | | | | |
|---|---|---|---|---|
| WO | 2012137539 A1 | 10/2012 | | |
| WO | WO 2012137539 A1 * | 10/2012 | | G02B 5/283 |

* cited by examiner

SEMICONDUCTOR DEVICE AND SEMICONDUCTOR DEVICE MANUFACTURING METHOD

CROSS-REFERENCE TO RELATED APPLICATION

This application is based on and claims priority under 35 USC 119 from Japanese Patent Application No. 2015-209226 filed on Oct. 23, 2015, the disclosure of which is incorporated by reference herein.

BACKGROUND

Technical Field

The present disclosure relates to a semiconductor device and a semiconductor device manufacturing method.

Related Art

As the amount of ultraviolet radiation increases due to destruction of the ozone layer, there is growing concern today over the effect of the ultraviolet rays in sunlight on the human body and the environment.

Ultraviolet rays are classified into long-wavelength ultraviolet rays (UV-A: approximate wavelength of from 320 nm to 400 nm), medium-wavelength ultraviolet rays (UV-B: approximate wavelength of from 280 nm to 320 nm), and short-wavelength ultraviolet rays (UV-C: approximate wavelength of 280 nm and below), with each of these wavelength regions having a different effect on the human body and the environment. UV-A waves cause darkening of the skin, reach the dermis, and are a cause of skin aging. UV-B waves cause inflammation of the skin and may lead to skin cancer. UV-C waves have a strong germicidal effect, but UV-C waves are absorbed by the ozone layer and do not reach the surface of the earth.

Rapid notification of the daily amount of ultraviolet radiation is a matter of importance when it comes to protecting the human body. The UV index, which is an indicator of the amount of ultraviolet radiation, was introduced in 1995. The UV index is a measure of the relative impact on the human body, and may be calculated using the CIE action spectrum defined by the CIE (Commission Internationale de l'Éclairage/International Commission on Illumination).

Japanese Patent Application Laid-Open (JP-A) No. 2008-251709 proposes an ultraviolet ray receiving element capable of separating and detecting quantities of ultraviolet rays in two wavelength regions, UV-A waves and UV-B waves, so as to simplify the derivation of the UV index. This ultraviolet ray receiving element includes a silicon semiconductor layer having a thickness of from 3 nm to 36 nm formed above an insulating layer, lateral PN-junction type first and second photodiodes formed in the silicon semiconductor layer, an interlayer insulating film formed above the silicon semiconductor layer, a first filter layer configured from silicon nitride that is formed above the interlayer insulating film above the first photodiode and that transmits light having a wavelength in the UV-B wave wavelength region or longer, and a second filter layer configured from silicon nitride that is formed above the interlayer insulating film above the second photodiode and that transmits light having a wavelength in the UV-A wave wavelength region or longer.

Japanese Patent Application Laid-Open (JP-A) No. 2009-176835 describes an ultraviolet sensor including a filter film configured from a silicon nitride film that is formed on an interlayer insulating film above one photodiode and that transmits light having a wavelength in the UV-A wave wavelength region or longer, and a sealing layer that covers the interlayer insulating film and the filter film above another photodiode and that transmits light having a wavelength in the UV-B wave wavelength region or longer.

International Publication Pamphlet (WO) No. 2012/137539 describes an ultraviolet sensor including a filter on the light receiving face side of a light receiving element that transmits UV-A waves and UV-B waves.

The filter is configured by a multilayer film of alternatingly stacked low refractive index material and high refractive index material.

In JP-A2008-251709 and JP-A2009-176835, filters are configured using a single layer of silicon nitride film that, of UV-A waves and UV-B waves, blocks the UV-B waves and transmits the UV-A waves.

FIG. 1 is a graph, obtained by the present inventors, illustrating the spectral sensitivity of an ultraviolet sensor for cases in which a filter formed from a single layer of silicon nitride film is formed above the ultraviolet sensor. FIG. 1 illustrates cases in which a silicon nitride film (SiN) has a thickness of 100 nm and 200 nm, in addition to a case in which a silicon nitride film is not provided.

As illustrated in FIG. 1, providing a filter film formed from a single layer of silicon nitride film reduces sensitivity toward not only UV-B waves (approximate wavelength of from 280 nm to 320 nm), but also UV-A waves (approximate wavelength of from 320 nm to 400 nm). Namely, precise separation of UV-A waves and UV-B waves is considered to be difficult using a filter film formed from a single layer of silicon nitride film.

SUMMARY

The present disclosure has been arrived at in consideration of the above circumstances, and has an objective of providing a semiconductor device and a semiconductor device manufacturing method that are capable of separating UV-A waves and UV-B waves more precisely than hitherto.

A semiconductor device according to the present disclosure includes a pair of photoelectric transducers that output photocurrent that accords with an intensity of received light and a first filter film. The first filter film is provided to a light incidence side of one out of the pair of photoelectric transducers, is configured by alternatingly stacking high refractive index layers and low refractive index layers having mutually different refractive indexes, and transmits one out of either UV-A waves or UV-B waves included in ultraviolet rays with a higher transmittance than the other out of the UV-A waves and the UV-B waves.

A semiconductor device manufacturing method according to the present disclosure includes a process of forming a pair of photoelectric transducers on a semiconductor layer, and a process of forming a first filter film on a light incidence side of one out of the pair of photoelectric transducers. The first filter film is configured by alternatingly stacking high refractive index layers and low refractive index layers having mutually different refractive indexes, and transmits one out of either UV-A waves or UV-B waves with a higher transmittance than the other out of the UV-A waves and the UV-B waves.

The semiconductor device and the semiconductor device manufacturing method according to the present disclosure enable UV-A waves and UV-B waves to be separated more precisely than hitherto.

BRIEF DESCRIPTION OF THE DRAWINGS

Exemplary embodiments of the present disclosure will be described in detail based on the following figures, wherein.

DETAILED DESCRIPTION

Figure 1:
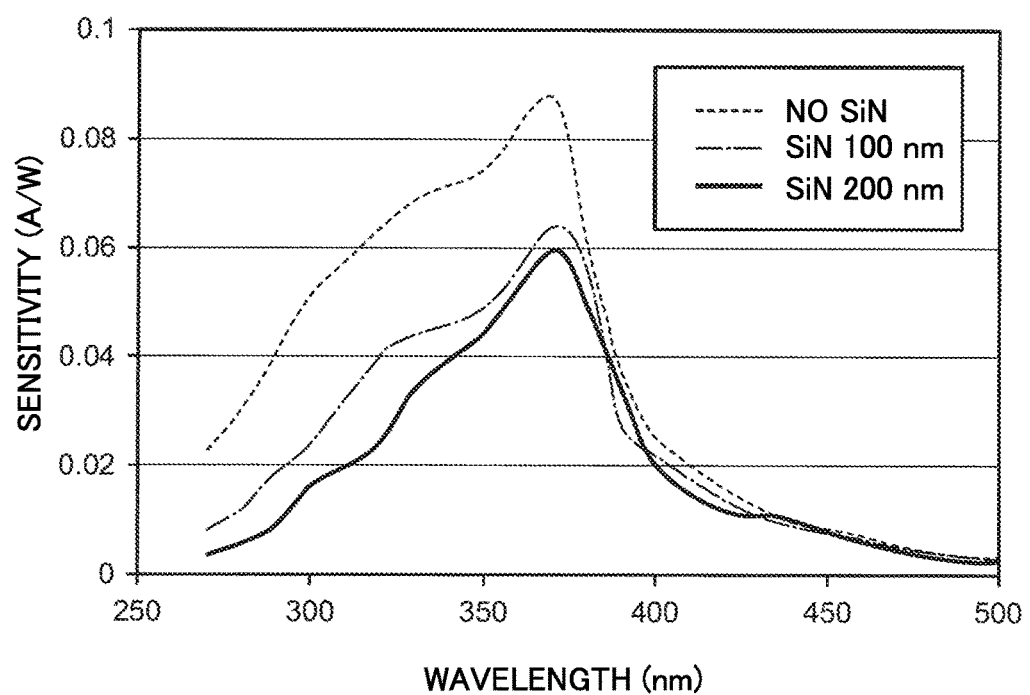
FIG. 1 is a graph illustrating the spectral sensitivity of an ultraviolet sensor for cases in which a filter formed from a silicon nitride film is formed above the ultraviolet sensor.

Explanation follows regarding exemplary embodiments of the present disclosure, with reference to the figures. Note that in each of the drawings, configuration elements and portions that are the same or that are equivalent are appended with the same reference numerals, and duplicate explanation is omitted as appropriate.

First Exemplary Embodiment

Figure 2:
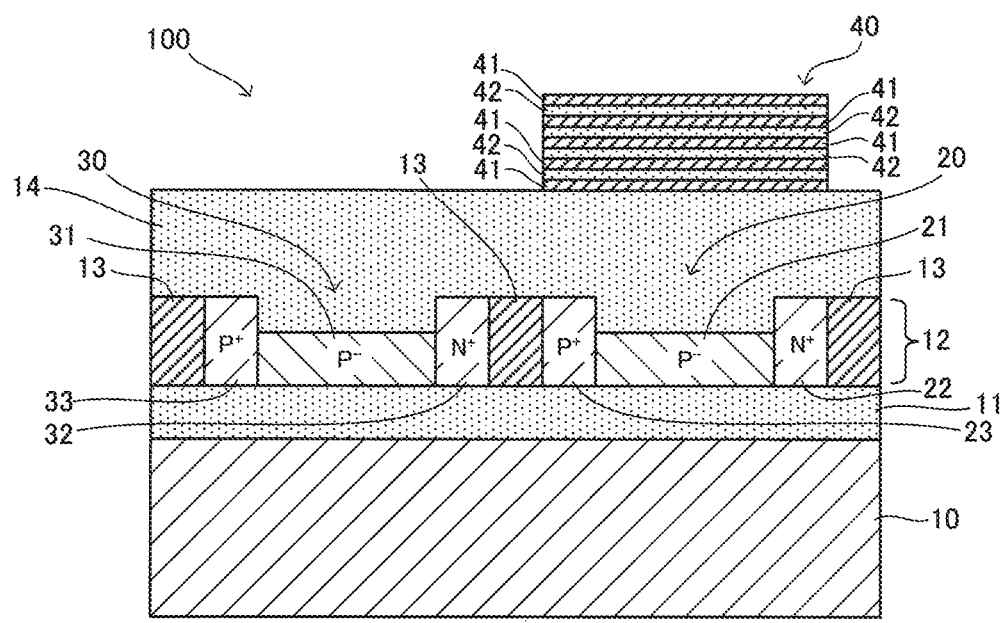
FIG. 2 is a cross-section illustrating configuration of a semiconductor device according to an exemplary embodiment of the present disclosure.

FIG. 2 is a cross-section illustrating configuration of a semiconductor device 100 configuring an ultraviolet sensor according to an exemplary embodiment of the present disclosure. The semiconductor device 100 includes a first photodiode 20 and a second photodiode 30 that are formed in a semiconductor layer 12 of a silicon-on-insulator (SOI) substrate in which a substrate layer 10, an insulator layer 11, and the semiconductor layer 12 are stacked. The first photodiode 20 and the second photodiode 30 are photoelectric transducers that output photocurrent that accords with the intensity of ultraviolet rays radiated thereon. The first photodiode 20 and the second photodiode 30 are insulated from each other by an element isolator 13 that is formed from an insulator such as $SiO_2$ and that surrounds the periphery of the first photodiode 20 and the second photodiode 30. The first photodiode 20 and the second photodiode 30 are provided adjacent to each other with the element isolator 13 sandwiched therebetween.

The first photodiode 20 includes a cathode 22 formed from an n-type semiconductor having a relatively high concentration of impurities, an anode 23 formed from a p-type semiconductor having a relatively high concentration of impurities, and a low concentration region 21 that is formed from a p-type semiconductor having a relatively low concentration of impurities and is provided between the cathode 22 and the anode 23. The low concentration region 21 is the principle light receiving region in the first photodiode 20. The thickness of the low concentration region 21 is thinner than that of the cathode 22 and the anode 23, and is set to 36 nm or less, for example. Setting the thickness of the low concentration region 21 forming the light receiving region to 36 nm or less enables the first photodiode 20 to be imparted with a reduced sensitivity toward light having a longer wavelength than ultraviolet rays including UV-A waves and UV-B waves, and the first photodiode 20 to be provided with a spectral sensitivity suitable for an ultraviolet sensor.

The second photodiode 30 has a similar configuration to the first photodiode 20. Namely, the second photodiode 30 includes a cathode 32 formed from an n-type semiconductor having a relatively high concentration of impurities, an anode 33 formed from a p-type semiconductor having a relatively high concentration of impurities, and a low concentration region 31 formed from a p-type semiconductor having a relatively low concentration of impurities provided between the cathode 32 and the anode 33. The low concentration region 31 is the principle light receiving region in the second photodiode 30. The thickness of the low concentration region 31 is thinner than that of the cathode 32 and the anode 33, and is set to 36 nm or less, for example.

The first photodiode 20 and the second photodiode 30 are covered by an insulator layer 14 formed from an insulator such as $SiO_2$. Plural wiring layers may be provided within the insulator layer 14. In cases in which there are four wiring layers, for example, the thickness of the insulator layer 14 is set to approximately 4 μm.

A filter film 40 that covers an area above the first photodiode 20 is provided to the surface of the insulator layer 14. Namely, the filter film 40 is provided to the light incidence side of the first photodiode 20. In the present exemplary embodiment the filter film 40 is wavelength selective, transmitting UV-A waves with a higher transmittance than UV-B waves. In other words, for UV-A waves and UV-B waves, the filter film 40 is wavelength selective, reflecting UV-B waves with a greater reflectance than UV-A waves.

The filter film 40 has a stacked structure of alternatingly stacked high refractive index layers 41 having a relatively high refractive index and low refractive index layers 42 having a relatively low refractive index. In the present exemplary embodiment, as illustrated in FIG. 2, a high refractive index layer 41 is placed adjacent to the insulator layer 14, and there are five high refractive index layers 41 and four low refractive index layers 42. However, the filter film 40 is not limited to such configuration. Namely, a low refractive index layer 42 may be placed adjacent to the insulator layer 14, and the number of high refractive index layers 41 and low refractive index layers 42 may be modified as appropriate.

The difference between the refractive indexes of the high refractive index layers 41 and the low refractive index layers 42 is preferably 0.4 or greater, and the refractive index of the high refractive index layers 41 is preferably 2 or less. A silicon dioxide film ($SiO_2$), which has a refractive index of about 1.4, may be suitably employed as the material of the low refractive index layers 42. A silicon nitride film ($Si_3N_4$), which has a refractive index of approximately 1.8, may be suitably employed as the material of the high refractive index layers 41.

Denoting the refractive index of the high refractive index layers 41 as $n_1$, the refractive index of the low refractive index layers 42 as $n_2$, and the central wavelength of the UV-B waves toward which the filter film 40 has a relatively low transmittance as $\lambda_{cb}$ (approximately 300 nm), it is preferable to determine standard values for the layer thickness $d_1$ of the high refractive index layers 41 and the layer thickness $d_2$ of the low refractive index layers 42 such that Equation (1) and Equation (2) given below are respectively satisfied.

$$n_1 \cdot d_1 = \lambda_{cb}/4 \quad (1)$$

$$n_2 \cdot d_2 = \lambda_{cb}/4 \quad (2)$$

Namely, the filter film 40 is configured such that the optical path length in each of the high refractive index layers 41 and the low refractive index layers 42 is one fourth of the central wavelength $\lambda_{cb}$ of the UV-B waves. By determining the layer thickness $d_1$ of the high refractive index layers 41 and the layer thickness $d_2$ of the low refractive index layers 42 such that Equation (1) and Equation (2) are satisfied, the phases of UV-B waves that are incident to the filter film 40 and reflected at the interfaces between the high refractive index layers 41 and the low refractive index layers 42 are in-phase such that the UV-B waves reinforce one another, while UV-B waves that proceed in the transmission direction are attenuated. Namely, the filter film 40 configured as above can be provided with a wavelength selectivity that transmits UV-A waves with a higher transmittance than UV-B waves.

In other words, the filter film 40 configured as described above can be provided with a wavelength selectivity in which UV-B wave transmittance is suppressed to a specific value or lower.

In a case in which the central wavelength $\lambda_{cb}$ of the UV-B waves is 300 nm, the refractive index $n_1$ of the high refractive index layers 41 is 1.8, and the refractive index $n_2$ of the low refractive index layers 42 is 1.4, the standard value for the layer thickness $d_1$ of the high refractive index layers 41 is calculated to be 41.6 nm using Equation (1), and the standard value for the layer thickness $d_2$ of the low refractive index layers 42 is calculated to be 53.6 nm using Equation (2).

When a range of wavelengths $\lambda_b$ of the UV-B waves for which the filter film 40 has a relatively low transmittance is $\lambda_{b1} \leq \lambda_b \leq \lambda_{b2}$ ($\lambda_{b1}$ is approximately 280 nm, and $\lambda_{b2}$ is approximately 320 nm), it is preferable to determine a range for the layer thickness $d_1$ of the high refractive index layers 41 and a range for the layer thickness $d_2$ of the low refractive index layers 42 such that Equation (3) and Equation (4) given below are respectively satisfied.

$$\lambda_{b1}/(4 \cdot n_1) \leq d_1 \leq \lambda_{b2}/(4 \cdot n_1) \quad (3)$$

$$\lambda_{b1}/(4 \cdot n_2) \leq d_2 \leq \lambda_{b2}/(4 \cdot n_2) \quad (4)$$

The filtering function of the filter film 40 to suppress the UV-B wave transmittance to a specific value or lower is effectively realized by determining the range for the layer thickness $d_1$ of the high refractive index layers 41 and the range for the layer thickness $d_2$ of the low refractive index layers 42 as above.

Figure 3:
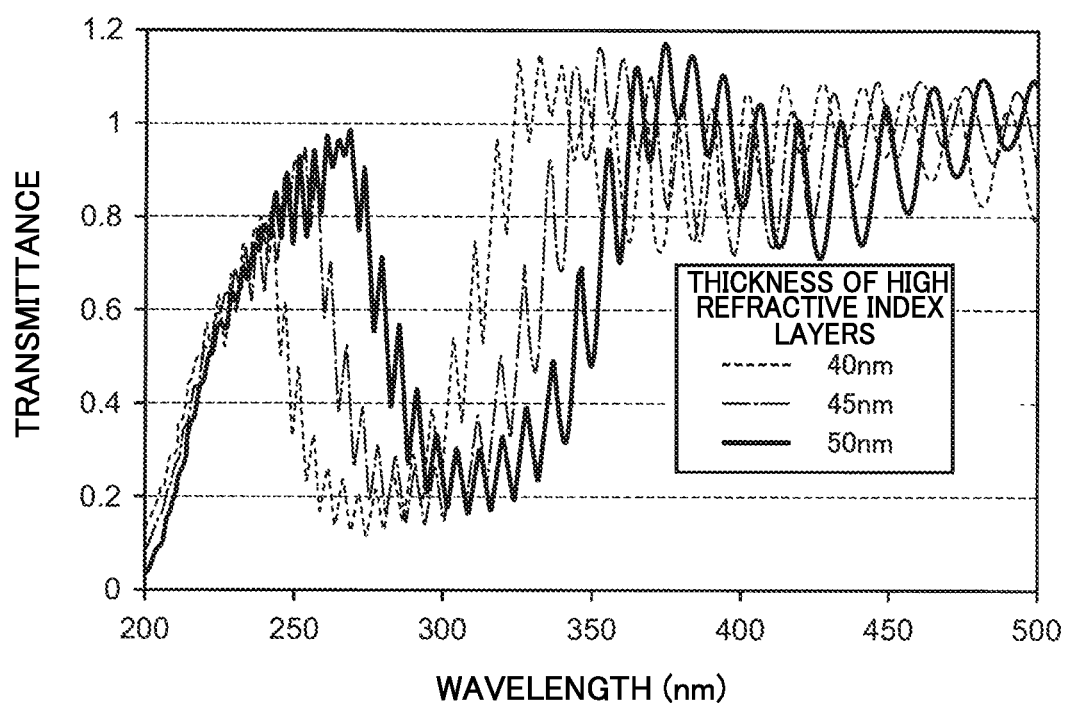
FIG. 3 is a graph illustrating results from a simulation of transmittance-wavelength characteristics in a filter according to an exemplary embodiment of the present disclosure.

FIG. 3 is a graph illustrating results from a simulation of transmittance-wavelength characteristics of the filter film 40, for respective cases in which the layer thickness of the low refractive index layers 42 was fixed at 50 μm, and the layer thickness of the high refractive index layers 41 was set to 40 μm, 45 μm, or 50 μm. Note that the refractive index of the high refractive index layers 41 was set to 1.8, and the refractive index of the low refractive index layers 42 was set to 1.4.

As illustrated in FIG. 3, it was confirmed that it is possible to reduce the transmittance of the filter film 40 in the UV-B wave wavelength region (from 280 nm to 320 nm) without impacting the transmittance of the filter film 40 in the UV-A wave wavelength region (from 320 nm to 400 nm) for each of the cases in which the layer thickness of the high refractive index layers 41 was respectively set to 40 μm, 45 μm, or 50 μm. It was also confirmed that increasing the layer thickness of the high refractive index layers 41 shifts the wavelengths for which the filter film 40 suppresses transmittance to a specific value or lower, shifting the wavelengths toward the longer wavelength side.

In the semiconductor device 100 according to the present exemplary embodiment, a filter film is not provided to the light incidence side of the second photodiode 30. Namely, the second photodiode 30 receives both UV-A waves and UV-B waves.

Explanation follows regarding a manufacturing method of the semiconductor device 100 according to the present exemplary embodiment. FIGS. 4A to 4C, FIG. 5A, FIG. 5B, FIG. 6A, and FIG. 6B are cross-sections illustrating an example of a manufacturing method of the semiconductor device 100.

Figure 4A:
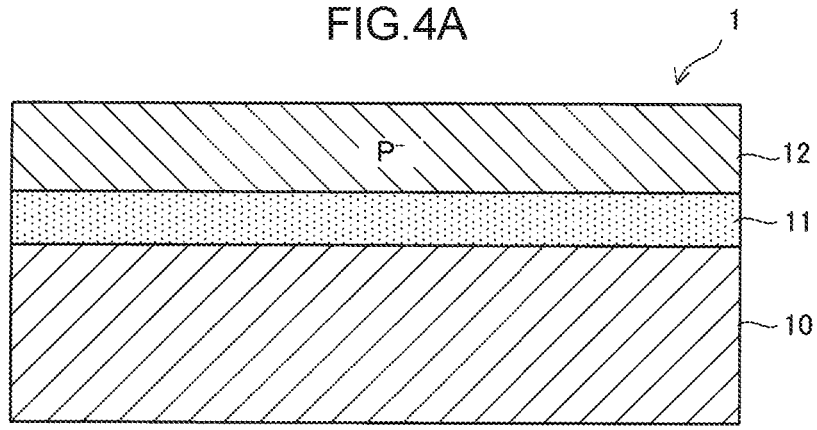
FIG. 4A is a cross-section illustrating a semiconductor device manufacturing method according to an exemplary embodiment of the present disclosure.

Firstly, a SOI substrate 1 in which the substrate layer 10, the insulator layer 11, and the semiconductor layer 12 are stacked is prepared (FIG. 4A). In the present exemplary embodiment, the semiconductor layer 12 is formed from p-type silicon. The semiconductor layer 12 then undergoes ion implantation processing to give the impurity concentrations in the low concentration regions 21, 31 of the first and second photodiodes 20, 30.

Figure 4B:
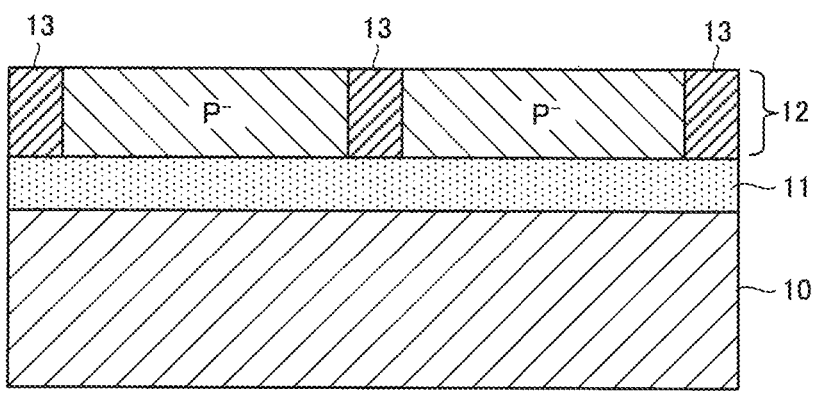
FIG. 4B is a cross-section illustrating a semiconductor device manufacturing method according to an exemplary embodiment of the present disclosure.

Next, the element isolator 13 that surrounds formation regions of the first photodiode 20 and the second photodiode 30 is formed in the semiconductor layer 12 (FIG. 4B). The element isolator 13 may be formed using a known shallow trench isolation (STI) process, for example. The STI process includes a process of forming trenches in the semiconductor layer 12 that reach to the insulator layer 11, a process of filling the trenches in with an insulator such as $SiO_2$, and a process of removing unwanted insulator that has been deposited on the surface of the semiconductor layer 12 by chemical mechanical polishing (CMP). Note that the element isolator 13 may also be formed using a known local oxidation of silicon (LOCOS) process.

Figure 4C:
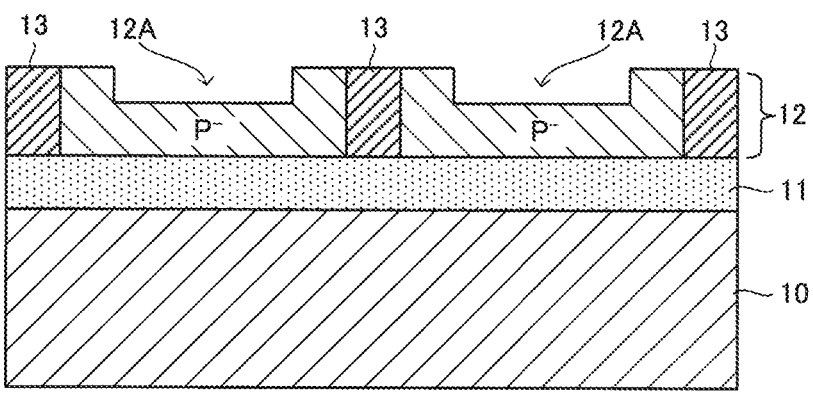
FIG. 4C is a cross-section illustrating a semiconductor device manufacturing method according to an exemplary embodiment of the present disclosure.

Next, the semiconductor layer 12 is partially etched to form respective depressions 12A in regions that correspond to the low concentration regions 21, 31 of the first and second photodiodes 20, 30. The thickness in the regions that correspond to the low concentration regions 21, 31 of the semiconductor layer 12 is thereby thinned to approximately 36 nm (FIG. 4C). Setting the thickness of the regions that correspond to the low concentration regions 21, 31 to 36 nm or less enables the first and second photodiodes 20, 30 to be imparted with a reduced sensitivity toward light having a longer wavelength than ultraviolet rays including UV-A waves and UV-B waves, and enables the first and second photodiodes 20, 30 having a spectral sensitivity suitable for an ultraviolet sensor to be obtained.

Figure 5A:
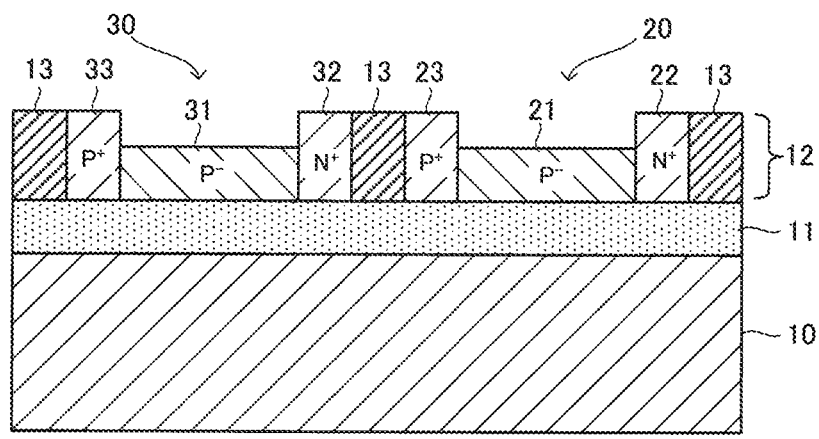
FIG. 5A is a cross-section illustrating a semiconductor device manufacturing method according to an exemplary embodiment of the present disclosure.

Next, the cathodes 22, 32 of the first and second photodiodes 20, 30 are formed by implanting group V elements such as phosphorus or arsenic into the semiconductor layer 12 using a known ion implantation process. Then, the anodes 23, 33 of the first and second photodiodes 20, 30 are formed by implanting group III elements such as boron into the semiconductor layer 12 using a known ion implantation process. In the first photodiode 20, the low concentration region 21 is disposed at the position where the depression 12A is formed, and the cathode 22 and the anode 23 are disposed at positions sandwiching the low concentration region 21. In the second photodiode 30, the low concentration region 31 is disposed at the position where the depression 12A is formed, and the cathode 32 and the anode 33 are disposed at positions sandwiching the low concentration region 31 (FIG. 5A).

Figure 5B:
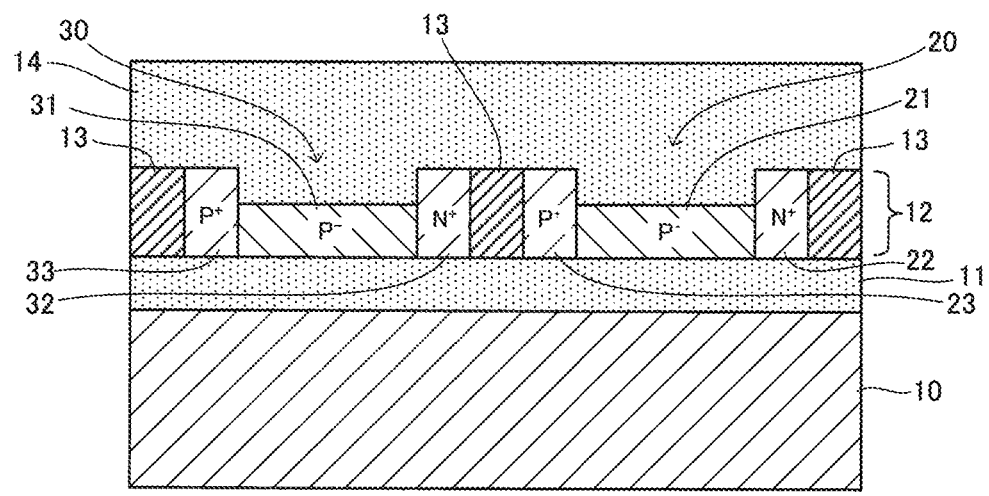
FIG. 5B is a cross-section illustrating a semiconductor device manufacturing method according to an exemplary embodiment of the present disclosure.

Next, using a CVD process, the insulator layer 14, which is formed from an insulator such as $SiO_2$, is formed on the surface of the semiconductor layer 12 that has been formed with the first and second photodiodes 20, 30 (FIG. 5B). Plural wiring layers may be provided within the insulator layer 14. In cases in which there are four wiring layers, for example, the thickness of the insulator layer 14 is set to approximately 4 μm.

Figure 6A:
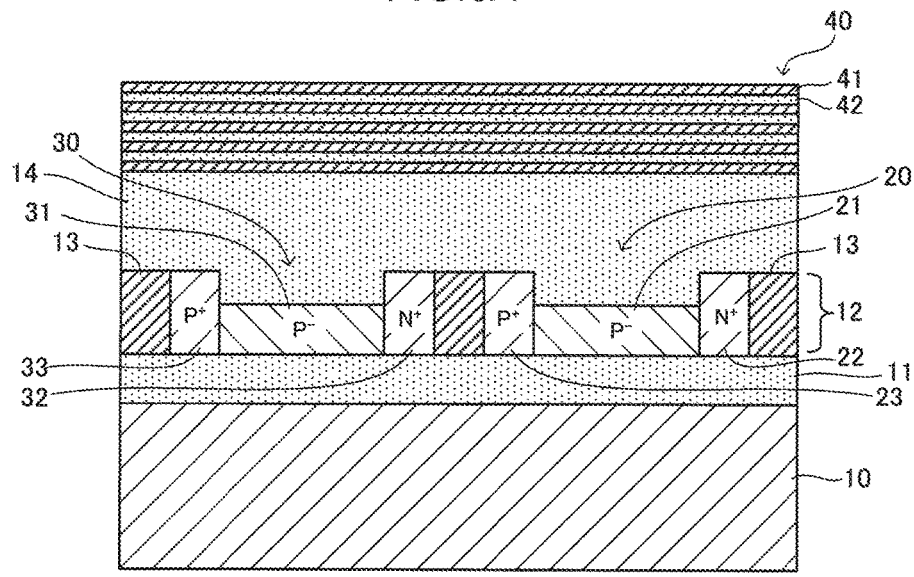
FIG. 6A is a cross-section illustrating a semiconductor device manufacturing method according to an exemplary embodiment of the present disclosure.

Next, the high refractive index layers 41 and the low refractive index layers 42 are alternatingly stacked on the surface of the insulator layer 14 to form the filter film 40 (FIG. 6A).

The high refractive index layers 41 may be formed from silicon nitride films ($Si_3N_4$) that are formed using a plasma CVD process employing $SiH_4$ (silane) and $NH_3$ (ammonia) as the source gases, for example. The refractive index of the high refractive index layers 41 can be controlled by controlling the flow rate of $SiH_4$. In the present exemplary embodiment, the flow rate of $SiH_4$ is set to $1.69\times10^{-2}$ Pa·m$^3$/sec and the flow rate of $NH_3$ is set to $1.27\times10^{-1}$ Pa·m$^3$/sec such that the high refractive index layers 41 formed from the silicon nitride films have a refractive index of approximately 1.8.

The low refractive index layers 42 may be formed from silicon dioxide films ($SiO_2$) that are formed using a plasma CVD process employing tetraethyl orthosilicate (TEOS) and oxygen ($O_2$) as the source gases. The low refractive index layers 42 formed from the silicon dioxide films have a refractive index of approximately 1.4.

The high refractive index layers 41 and the low refractive index layers 42 are formed such that the layer thickness $d_1$ of the high refractive index layers 41 and the layer thickness $d_2$ of the low refractive index layers 42 respectively satisfy Equation (3) and Equation (4) above. Thus, the filter film 40 is formed having a wavelength selectivity that suppresses the UV-B wave transmittance to a specific value or lower.

Figure 6B:
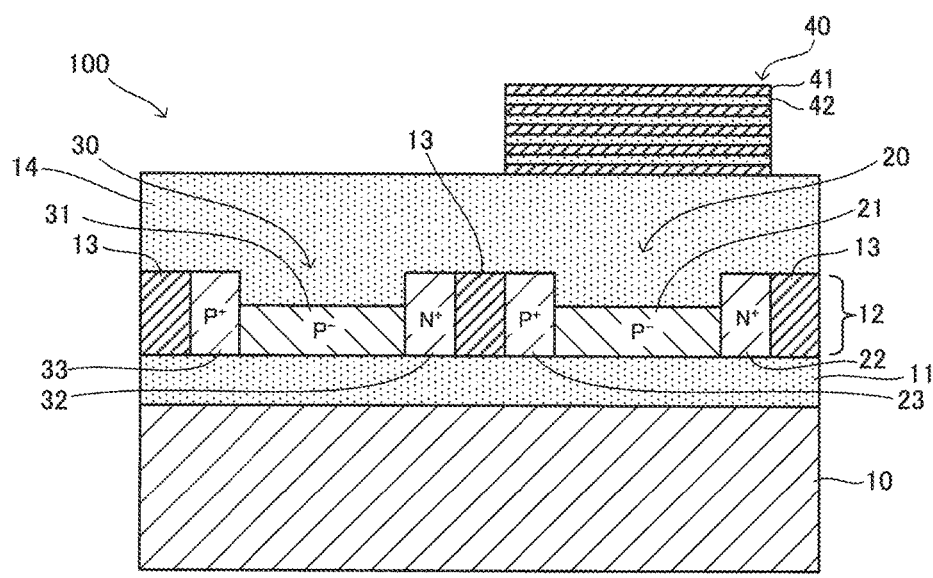
FIG. 6B is a cross-section illustrating a semiconductor device manufacturing method according to an exemplary embodiment of the present disclosure.

Next, patterning of the filter film 40 is performed using etching so as to remove portions of the filter film 40 covering the area above the second photodiode 30 (FIG. 6B). Note that the patterning of the filter film 40 may be performed using a lift-off process.

Figure 7:
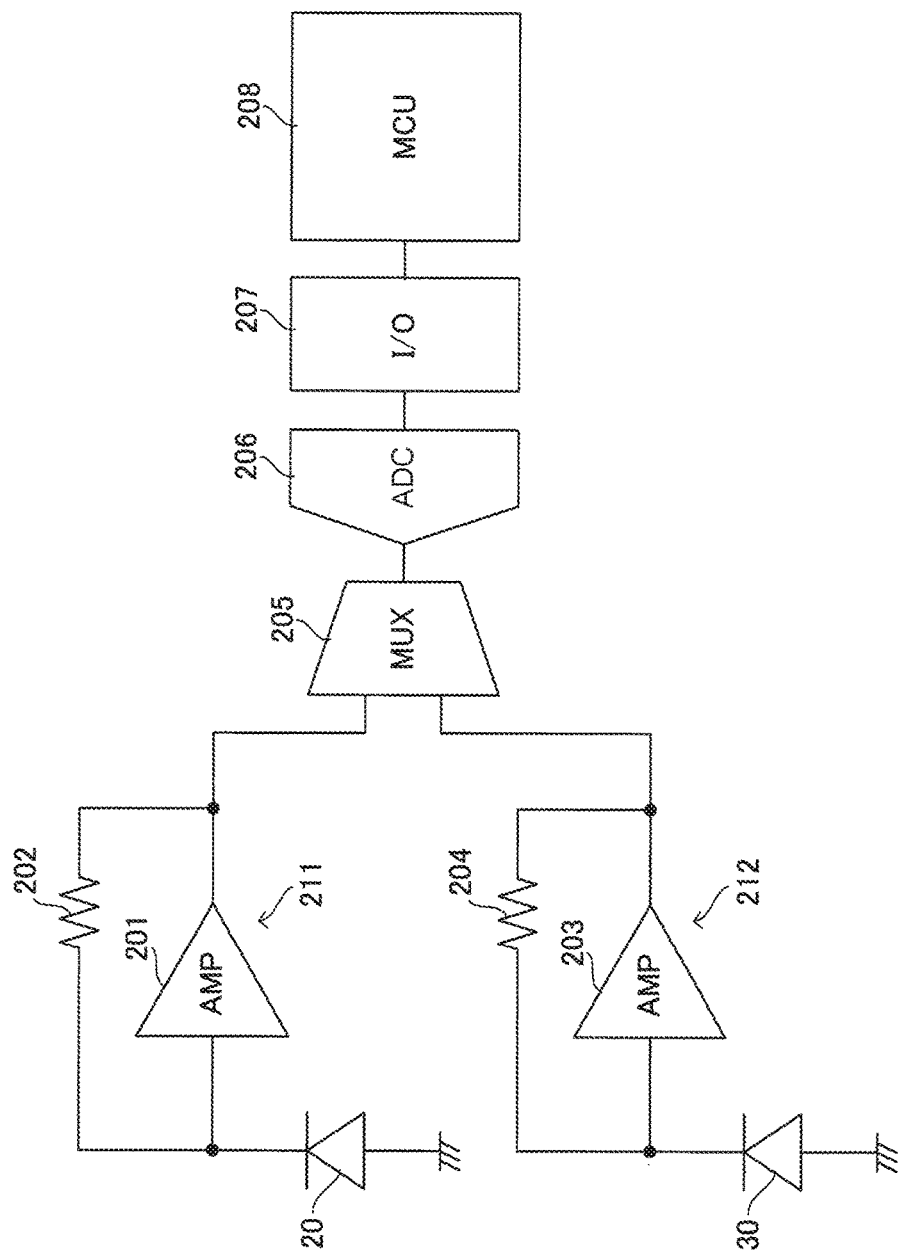
FIG. 7 is a circuit block diagram illustrating an example of configuration of a signal processing system according to an exemplary embodiment of the present disclosure.

FIG. 7 is a circuit block diagram illustrating an example of configuration of a signal processing system according to an exemplary embodiment of the present disclosure, in which a UV index is derived based on photocurrent output from the first and second photodiodes 20, 30. The signal processing system is configured including operational amplifiers 201, 203, resistance elements 202, 204, a multiplexer 205, an analog-digital converter 206, an interface circuit 207, and a microcontroller unit 208 (referred to below as MCU 208). Each circuit configuring the signal processing system may be housed, together with the first and second photodiodes 20, 30, within a single semiconductor chip.

The photocurrent output from the first photodiode 20 is converted to a voltage by a transimpedance amplifier 211 configured including the operational amplifier 201 and the resistance element 202. Namely, a voltage of a magnitude proportionate to the magnitude of the photocurrent output from the first photodiode 20 is output from the transimpedance amplifier 211.

Similarly, the photocurrent output from the second photodiode 30 is converted to a voltage by a transimpedance amplifier 212 configured including the operational amplifier 203 and the resistance element 204. Namely, a voltage of a magnitude proportionate to the magnitude of the photocurrent output from the second photodiode 30 is output from the transimpedance amplifier 212.

The multiplexer 205 sequentially supplies the voltages output from the transimpedance amplifiers 211, 212 to the analog-digital converter 206.

The analog-digital converter 206 converts the voltage supplied from the multiplexer 205 to a digital signal. Namely, the analog-digital converter 206 generates a digital value $D_1$ that accords with the photocurrent output from the first photodiode 20 and a digital value $D_2$ that accords with the photocurrent output from the second photodiode 30. The digital value $D_1$ represents the intensity of ultraviolet rays from which the UV-B wave component has been removed by the filter film 40. In other words, the digital value $D_1$ represents the intensity of ultraviolet rays that predominantly include UV-A waves. In contrast thereto, the digital value $D_2$ represents the intensity of ultraviolet rays that include both UV-A waves and UV-B waves. The analog-digital converter 206 supplies the digital value $D_1$ and the digital value $D_2$ to the MCU 208 via the interface circuit 207.

Figure 8:
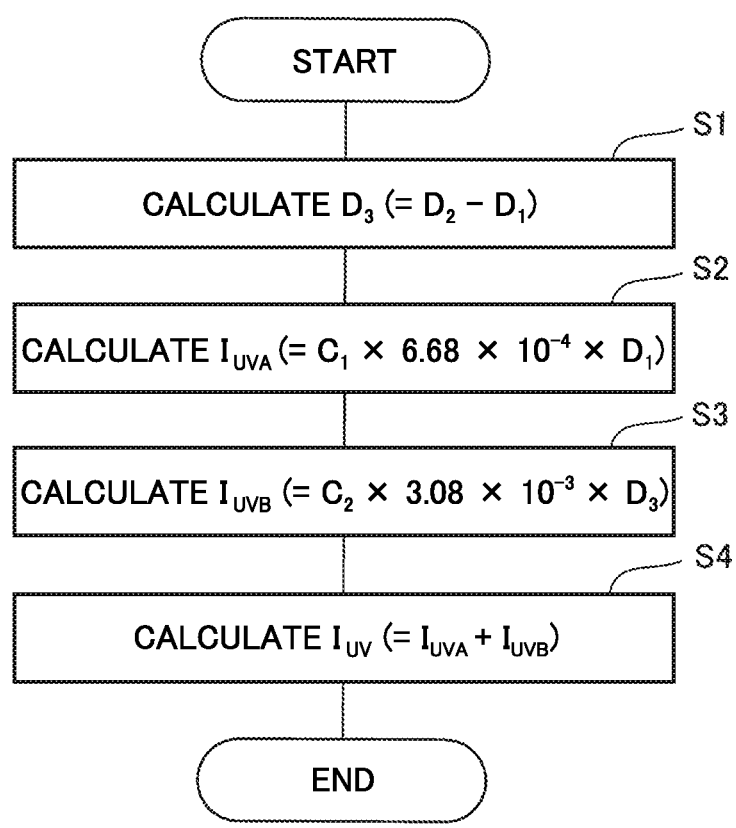
FIG. 8 is a flowchart illustrating a UV index calculation procedure of a MCU according to an exemplary embodiment of the present disclosure.

The MCU 208 calculates a UV index $I_{UV}$ using the procedure demonstrated below based on the digital value $D_1$ and the digital value $D_2$ supplied via the interface circuit 207. FIG. 8 is a flowchart illustrating a calculation procedure for the UV index $I_{UV}$ of the MCU 208.

At step S1, the MCU 208 subtracts the digital value $D_1$ from the digital value $D_2$ to derive a digital value $D_3$ ($D_3=D_2-D_1$). Digital value $D_3$ represents the intensity of ultraviolet rays that predominantly include UV-B waves.

At step S2, the MCU 208 calculates a UV-A wave component $I_{UVA}$ of the UV index as expressed by Equation (5) below.

$$I_{UVA} = c_1 \times 6.68 \times 10^{-4} \times D_1 \qquad (5)$$

At step S3, the MCU 208 calculates a UV-B wave component $I_{UVB}$ of the UV index as expressed by Equation (6) below.

$$I_{UVB} = c_2 \times 3.08 \times 10^{-3} \times D_3 \qquad (6)$$

Note that in Equation (5) and Equation (6), $c_1$ and $c_2$ are constants determined in accordance with properties of the operational amplifiers 201, 203 and with the areas of the first and second photodiodes 20, 30.

At step S4, the MCU 208 calculates the UV index $I_{UV}$ as expressed by Equation (7) below.

$$I_{UV} = I_{UVA} + I_{UVB} \qquad (7)$$

Figure 9:
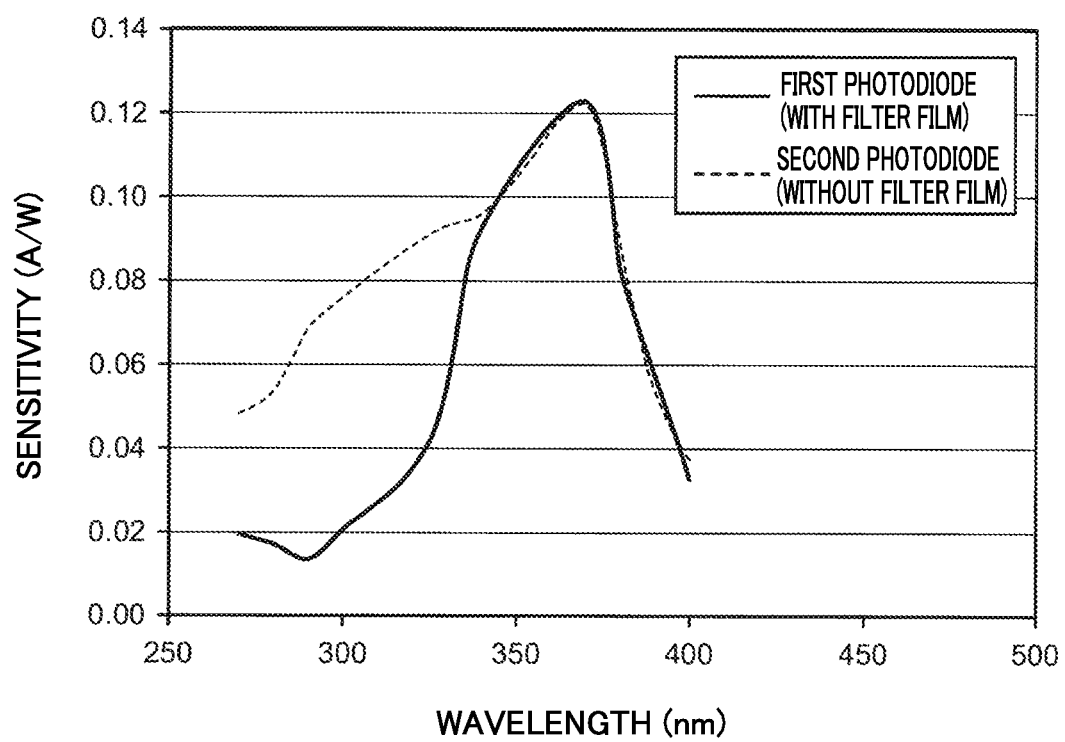
FIG. 9 is a graph illustrating actual measurement values of the spectral sensitivity of first and second photodiodes according to an exemplary embodiment of the present disclosure.

FIG. 9 is a graph illustrating actual measurement values of the spectral sensitivity of the first photodiode 20 that was covered by filter film 40 and the second photodiode 30 that was not covered by a filter film. Note that the high refractive index layers 41 were formed from 50 nm thick silicon nitride films ($Si_3N_4$), and the low refractive index layers 42 were formed from 50 nm thick silicon oxide films ($SiO_2$). Additionally, there were five high refractive index layers 41 and four low refractive index layers 42.

As illustrated in FIG. 9, the sensitivity toward UV-A waves of the first photodiode 20 having the filter film 40 on the light incidence side was similar to that of the second photodiode 30 not provided with a filter film. In contrast thereto, the sensitivity toward UV-B waves of the first photodiode 20 was notably lower than that of the second photodiode 30. Namely, providing the filter film 40 enabled UV-A waves to be transmitted with a higher transmittance than UV-B waves. Configuring the filter film 40 with stacked layers in this manner gives similar waveform shapes in one out of the UV-A wave wavelength region or the UV-B wave wavelength region and a large difference in waveform shapes in the other out of the UV-A wave wavelength region or the UV-B wave wavelength region. This thereby makes it possible to find the desired UV index with simple subtractive processing. As a result, rapid processing is possible even with a compact microprocessor capable of being run at low power, for example, and also enables operation on a wearable device such as a watch.

As is clear from the above explanation, in the semiconductor device 100 according to the present exemplary embodiment, the filter film 40 is configured by alternatingly stacking high refractive index layers and low refractive index layers formed with layer thicknesses that satisfy Equation (3) and Equation (4) above. Accordingly, the filter film 40 can be provided with a wavelength selectivity that transmits UV-A waves with a higher transmittance than UV-B waves. As is clear from comparing FIG. 1 and FIG. 9, the filter film 40 according to the present exemplary embodiment enables wavelength selectivity to be greatly improved compared to a conventional filter film formed from a single layer of silicon nitride film. Namely, the semiconductor device 100 according to an exemplary embodiment of the present disclosure and the manufacturing method thereof enable UV-A waves and UV-B waves to be separated more precisely than hitherto.

Setting the difference between the refractive indexes of the high refractive index layers 41 and the low refractive index layers 42 to 0.4 or greater enables the function of the filter film 40 to reflect UV-B waves to be sufficiently realized. Setting the refractive index of the high refractive index layers 41 to 2 or less also enables the transmittance for UV-A waves to be secured.

Figure 10:
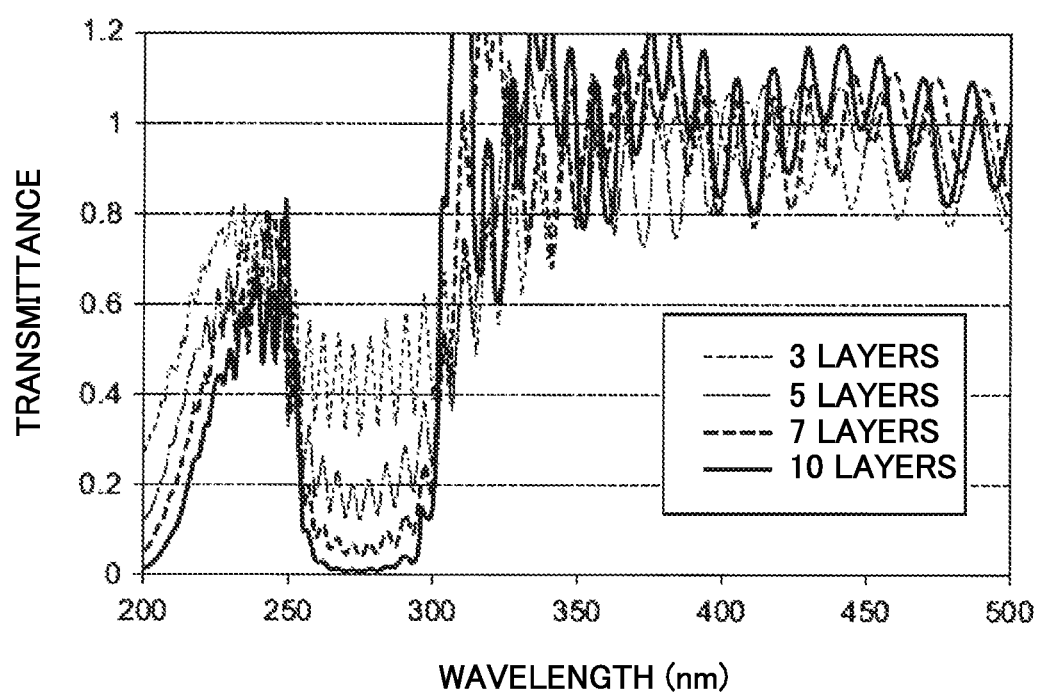
FIG. 10 is a graph illustrating results from a simulation of transmittance-wavelength characteristics in a filter film according to an exemplary embodiment of the present disclosure, for cases in which the number of high refractive index layers and low refractive index layers have been changed.

FIG. 10 is a graph illustrating results from a simulation of transmittance-wavelength characteristics in the filter film 40, for cases in which the number of high refractive index layers 41 and low refractive index layers 42 configuring the filter film 40 has been changed. As illustrated in FIG. 10, as the number of high refractive index layers 41 and low refractive index layers 42 configuring the filter film 40 is increased, the transmittance in the UV-B wave wavelength region is reduced. Namely, in the semiconductor device 100 according to the present exemplary embodiment, changing the number of high refractive index layers 41 and low refractive index layers 42 enables sensitivity toward UV-B waves to be increased or decreased.

In the semiconductor device 100 according to the present exemplary embodiment, strain (stress) arising in the semiconductor layer 12 increases as the number of high refractive index layers 41 and low refractive index layers 42 becomes greater, due to the filter film 40 only covering the first photodiode 20 out of the first and second photodiodes 20, 30, and this is liable to affect the characteristics of the first and second photodiodes 20, 30. With the semiconductor device 100 according to the present exemplary embodiment, by deriving the intensity of ultraviolet rays that predominantly include UV-B waves by subtracting the digital value $D_1$, which is based on photocurrent of the first photodiode 20, from the digital value $D_2$, which is based on photocurrent of the second photodiode 30, it is possible to effectively separate UV-A waves and UV-B waves even in cases in which the number of high refractive index layers 41 and low refractive index layers 42 is relatively low (for example, from five to ten layers). This thereby avoids the issue described above of strain (stress) arising in the semiconductor layer 12.

In the present exemplary embodiment, explanation has given regarding a case in which the filter film 40 that transmits UV-A waves with a higher transmittance than UV-B waves is provided to the light incidence side of the first photodiode 20; however, there is no limitation thereto. Namely, a filter film that transmits UV-B waves with a higher transmittance than UV-A waves may be provided to the light incidence side of the first photodiode 20. In such a case, the layer thicknesses of the high refractive index layers and the low refractive index layers configuring the filter film are set in conformance with Equation (3) and Equation (4) above. In Equation (3) and Equation (4), $\lambda_{b1}$ and $\lambda_{b2}$ are also respectively set to the lower limit value (320 nm) and the upper limit value (400 nm) of the UV-A wave wavelengths. Additionally, in the case in which a filter film that transmits UV-B waves with a higher transmittance than UV-A waves is employed, digital values $D_1$ and $D_3$ are interchanged in Equation (5) and Equation (6) above when calculating the UV index.

In the present exemplary embodiment, although a case in which silicon nitride films are employed as the high refractive index layers 41 has been given as an example, HfO$_2$ (hafnium oxide) may be employed as the high refractive index layers 41.

Second Exemplary Embodiment

Figure 11:
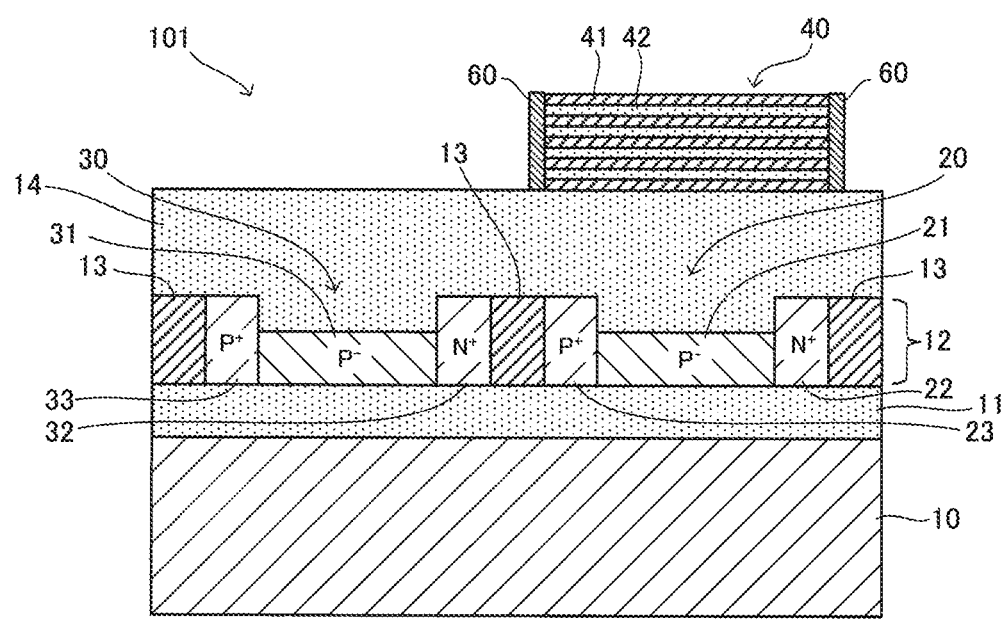
FIG. 11 is a cross-section illustrating configuration of a semiconductor device according to another exemplary embodiment of the present disclosure.

FIG. 11 is a cross-section illustrating configuration of a semiconductor device 101 according to a second exemplary embodiment of the present disclosure. The semiconductor device 101 according to the second exemplary embodiment differs from the semiconductor device 100 according to the first exemplary embodiment described above in that side faces of the filter film 40 are covered by a light-shielding film 60 that blocks ultraviolet rays. TiN (titanium nitride), for example, may be suitably employed as the material of the light-shielding film 60; however, other materials that block ultraviolet rays may also be used.

The light-shielding film 60 may, for example, be formed as follows. Note that in the following explanation, a case in which TiN is employed as the material of the light-shielding film 60 is given as an example. After completing the patterning of the filter film 40, TiN is deposited on the upper face of the insulator layer 14 and the upper face and side faces of the filter film 40 using a sputtering process or the like. Then, the portion of the TiN covering the upper face of the insulator layer 14 and the portion of the TiN covering the upper face of the filter film 40 are removed using dry etching. The portion of the TiN covering the side faces of the filter film 40 is not removed in the dry etching and is left behind. The light-shielding film 60 that covers the side faces of the filter film 40 is thereby formed.

Covering the side faces of the filter film 40 with a light-shielding film 60 that blocks ultraviolet rays in this manner enables ultraviolet rays that are incident to, and enter, the filter film 40 before being refracted and reflected so as to radiate out of the filter film 40 to be prevented from being incident to the adjacent second photodiode 30. Providing the light-shielding film 60 to the side faces of the filter film 40 can also prevent ultraviolet rays from being incident to, and entering, the filter film 40 from the side faces, and enables the filtering function to be effectively realized by the filter film 40.

Moreover, similarly to the semiconductor device 100 according to the first exemplary embodiment, the semiconductor device 101 according to the second exemplary embodiment of the present disclosure enables UV-A waves and UV-B waves to be separated more precisely than hitherto.

Third Exemplary Embodiment

Figure 12:
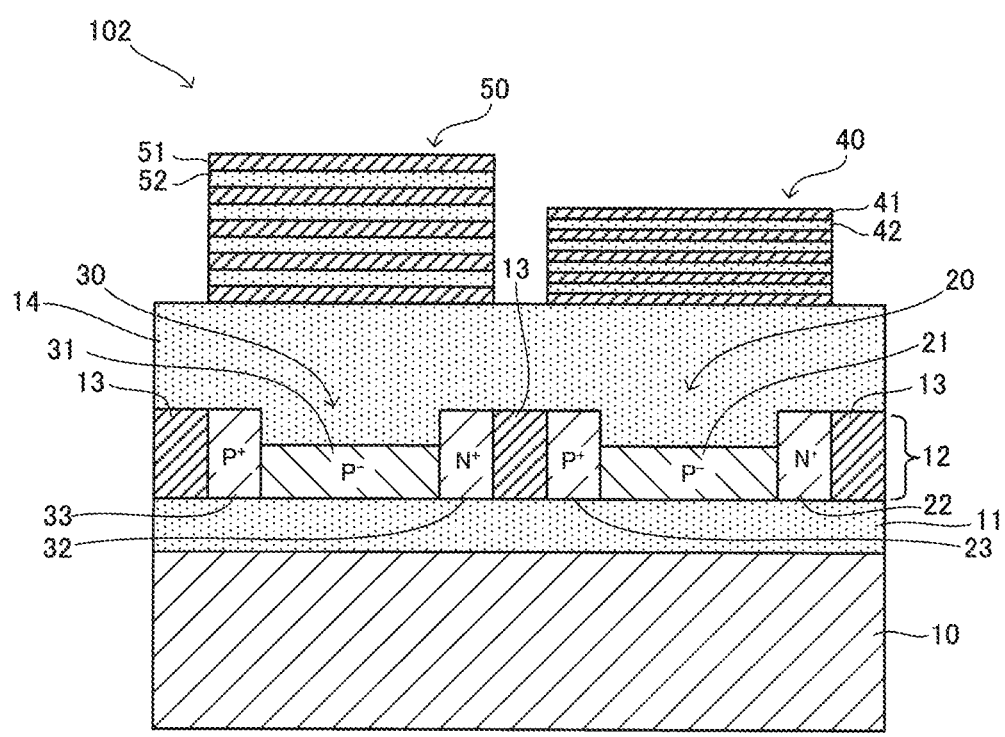
FIG. 12 is a cross-section illustrating configuration of a semiconductor device according to another exemplary embodiment of the present disclosure.

FIG. 12 is a cross-section illustrating configuration of a semiconductor device 102 according to a third exemplary embodiment of the present disclosure. The semiconductor device 102 according to the third exemplary embodiment differs from the semiconductor device 100 according to the first exemplary embodiment described above in that a filter film 50 that transmits UV-B waves with a higher transmittance than UV-A waves is provided to the light incidence side of the second photodiode 30. Note that the semiconductor device 102 according to the third exemplary embodiment is similar to the semiconductor device 100 according to the first exemplary embodiment in that the filter film 40 that transmits UV-A waves with a higher transmittance than UV-B waves is provided to the light incidence side of the first photodiode 20.

The filter film 50 is configured similarly to the filter film 40. Namely, the filter film 50 has a stacked structure of alternatingly stacked high refractive index layers 51 having a relatively high refractive index and low refractive index layers 52 having a relatively low refractive index. In the present exemplary embodiment, a high refractive index layer 51 is placed adjacent to the insulator layer 14, and there are five high refractive index layers 51 and four low refractive index layers 52; however, the filter film 50 is not limited to such configuration. Namely, a low refractive index layer 52 may be placed adjacent to the insulator layer 14, and the number of high refractive index layers 51 and low refractive index layers 52 may be modified as appropriate.

The difference between the refractive indexes of the high refractive index layers 51 and the low refractive index layers 52 is preferably 0.4 or greater, and the refractive index of the high refractive index layers 51 is preferably 2 or less. A silicon dioxide film (SiO$_2$), which has a refractive index of approximately 1.4, may be suitably employed as the material of the low refractive index layers 52. A silicon nitride film (Si$_3$N$_4$), which has a refractive index of approximately 1.8, may be suitably employed as the material of the high refractive index layers 51.

Denoting the refractive index of the high refractive index layers 51 as n$_3$, the refractive index of the low refractive index layers 52 as n$_4$, and the central wavelength of the UV-A waves toward which the filter film 50 has a relatively low transmittance as $\lambda_{ca}$ (approximately 360 nm), it preferable to determine standard values for the layer thickness d$_3$ of the high refractive index layers 51 and the layer thickness d$_4$ of the low refractive index layers 52 such that Equation (8) and Equation (9) given below are respectively satisfied.

$$n_3 \cdot d_3 = \lambda_{ca}/4 \tag{8}$$

$$n_4 \cdot d_4 = \lambda_{ca}/4 \tag{9}$$

Namely, the filter film 50 is configured such that the optical path length in each of the high refractive index layers 51 and the low refractive index layers 52 is one fourth of the central wavelength $\lambda_{ca}$ of the UV-A waves. By determining the layer thickness d$_3$ of the high refractive index layers 51 and the layer thickness d$_4$ of the low refractive index layers 52 such that Equation (8) and Equation (9) are satisfied, the phases of the UV-A waves that are incident to the filter film 50 and reflected at the interfaces between the high refractive index layers 51 and the low refractive index layers 52 are in-phase such that the UV-A waves reinforce one another, while UV-A waves that proceed in the transmission direction are attenuated. Namely, the filter film 50 configured as above can be provided with a wavelength selectivity that transmits UV-B waves with a higher transmittance than UV-A waves. In other words, the filter film 50 can be provided with a wavelength selectivity that suppresses UV-A wave transmittance to a specific value or lower.

In a case in which $\lambda_{ca}$ is 360 nm, n$_3$ is 1.8, and n$_4$ is 1.4, the standard value for the layer thickness d$_3$ of the high refractive index layers 51 is calculated to be 50 nm using Equation (8), and the standard value for the layer thickness d$_4$ of the low refractive index layers 52 is calculated to be 64.3 nm using Equation (9).

When a range of wavelengths $\lambda_a$ of the UV-A waves for which the filter film 50 has a relatively low transmittance is $\lambda_{a1} \leq \lambda_a \leq \lambda_{a2}$ ($\lambda_{a1}$ is approximately 320 nm, and $\lambda_{a2}$ is approximately 400 nm), it is preferable to determine a range for the layer thickness d$_3$ of the high refractive index layers 51 and a range for the layer thickness d$_4$ of the low refractive index layers 52 such that Equation (10) and Equation (11) given below are respectively satisfied.

$$\lambda_{a1}/(4 \cdot n_3) \leq d_3 \leq \lambda_{a2}/(4 \cdot n_3) \quad (10)$$

$$\lambda_{a1}/(4 \cdot n_4) \leq d_4 \leq \lambda_{a2}/(4 \cdot n_4) \quad (11)$$

The filtering function of the filter film 50 to suppress the UV-A wave transmittance to a specific value or lower is effectively realized by determining the range for the layer thickness $d_3$ of the high refractive index layers 51 and the range for the layer thickness $d_4$ of the low refractive index layers 52 as above.

Having the layer thicknesses of the high refractive index layers 51 and the low refractive index layers 52 in the filter film 50 be different from the layer thicknesses of the high refractive index layers 41 and the low refractive index layers 42 in the filter film 40 provides the filter film 50 with a different wavelength selectivity than the filter film 40.

The high refractive index layers 51 and the low refractive index layers 52 configuring the filter film 50 may be formed as films using a plasma CVD process, similarly to the filter film 40. The formation of the high refractive index layers 51 and the low refractive index layers 52 as films may be performed after patterning the filter film 40. As an example, the patterning of the filter film 50 may employ a known lift-off process.

Figure 13:
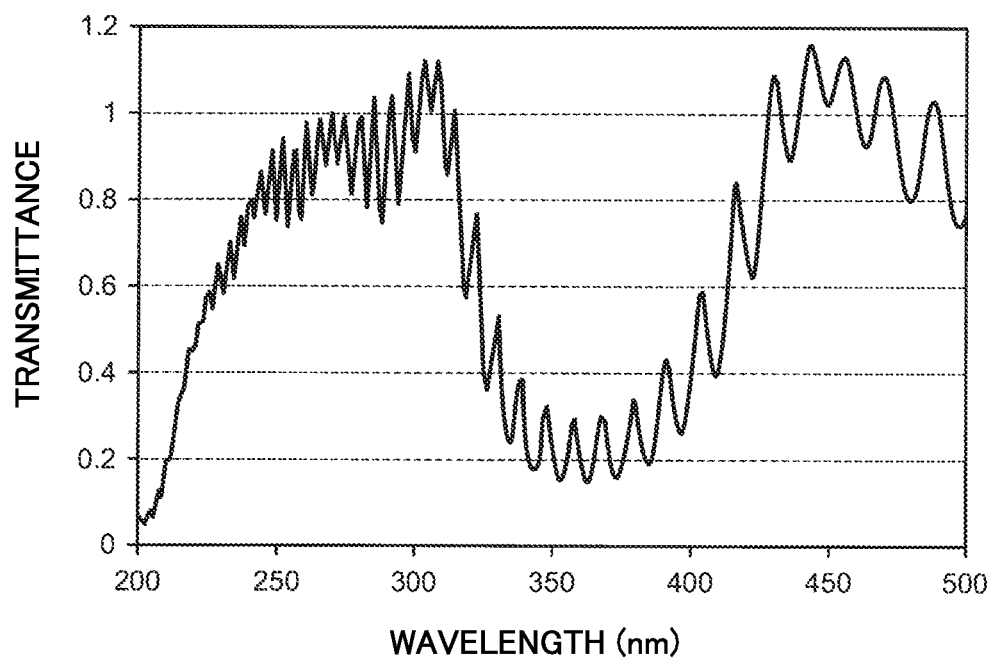
FIG. 13 is a graph illustrating results from a simulation of transmittance-wavelength characteristics in a filter film according to another exemplary embodiment of the present disclosure.

FIG. 13 is a graph illustrating results from a simulation of transmittance-wavelength characteristics in the filter film 50, for a case in which the layer thickness of the high refractive index layers 51 was set to 50 nm, and the layer thickness of the low refractive index layers 52 was set to 60 nm. Note that the refractive index of the high refractive index layers 51 was set to 1.8 and the refractive index of the low refractive index layers 52 was set to 1.4.

As illustrated in FIG. 13, it was confirmed that it is possible to reduce the transmittance of the filter film 50 in the UV-A wave wavelength region (from 320 nm to 400 nm) without impacting the transmittance of the filter film 50 in the UV-B wave wavelength region (from 280 nm to 320 nm)

In the semiconductor device 102 according to the present exemplary embodiment, photocurrent output from the first and second photodiodes 20, 30 is processed in the signal processing system illustrated in FIG. 7 as follows. The analog-digital converter 206 generates a digital value $D_1$ that accords with the photocurrent output from the first photodiode 20 and a digital value $D_2$ that accords with the photocurrent output from the second photodiode 30. The digital value $D_1$ represents the intensity of ultraviolet rays from which the UV-B wave component has been removed by the filter film 40. In other words, the digital value $D_1$ represents the intensity of ultraviolet rays that predominantly include UV-A waves. In contrast thereto, the digital value $D_2$ represents the intensity of ultraviolet rays from which the UV-A wave component has been removed by the filter film 50. In other words, the digital value $D_2$ represents the intensity of ultraviolet rays that predominantly include UV-B waves. The analog-digital converter 206 supplies the digital value $D_1$ and the digital value $D_2$ to the MCU 208 via the interface circuit 207.

Figure 14:
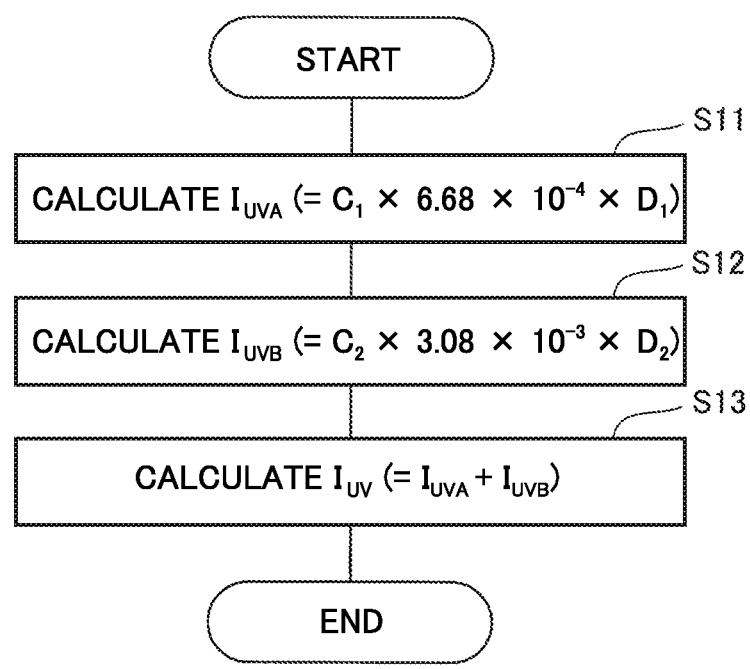
FIG. 14 is a flowchart illustrating a UV index calculation procedure of a MCU according to another exemplary embodiment of the present disclosure.

The MCU 208 calculates a UV index $I_{UV}$ using the procedure demonstrated below based on the digital value $D_1$ and the digital value $D_2$ supplied via the interface circuit 207. FIG. 14 is a flowchart illustrating a calculation procedure for the UV index $I_{UV}$ of the MCU 208 according to the present exemplary embodiment.

At step S11, the MCU 208 calculates a UV-A wave component $I_{UVA}$ of the UV index as expressed by Equation (12) below.

$$I_{UVA} = c_1 \times 6.68 \times 10^{-4} \times D_1 \quad (12)$$

At step S12, the MCU 208 calculates a UV-B wave component $I_{UVB}$ of the UV index as expressed by Equation (13) below.

$$I_{UVB} = c_2 \times 3.08 \times 10^{-3} \times D_2 \quad (13)$$

Note that in Equation (12) and Equation (13), $c_1$ and $c_2$ are constants determined in accordance with properties of the operational amplifiers 201, 203 and with the areas of the first and second photodiodes 20, 30.

At step S13, the MCU 208 calculates the UV index $I_{UV}$ as expressed by Equation (14) below.

$$I_{UV} = I_{UVA} + I_{UVB} \quad (14)$$

As described above, similarly to the semiconductor device 100 according to the first exemplary embodiment, the semiconductor device 102 according to the third exemplary embodiment of the present disclosure enables UV-A waves and UV-B waves to be separated more precisely than hitherto.

The semiconductor device 102 according to the third exemplary embodiment of the present disclosure can lessen the arithmetic processing load on the MCU 208 compared to the semiconductor device 100 according to the first exemplary embodiment, due to photocurrent based on UV-A waves being output from the first photodiode 20 and photocurrent based on UV-B waves being output from the second photodiode 30. Specifically, step S1 of FIG. 8 can be omitted in the MCU 208.

The semiconductor device 102 according to the third exemplary embodiment of the present disclosure can reduce strain (stress) arising in the semiconductor layer 12 compared to a case in which a filter film is only provided to one of the photodiodes, since filter films are respectively provided to the light incidence side of both the first photodiode 20 and the second photodiode 30.

A light-shielding film that blocks ultraviolet rays may also be provided to the side faces of the filter film 40 and the filter film 50 of the semiconductor device 102, similarly to the semiconductor device 101 according to the second exemplary embodiment.

Fourth Exemplary Embodiment

Figure 15:
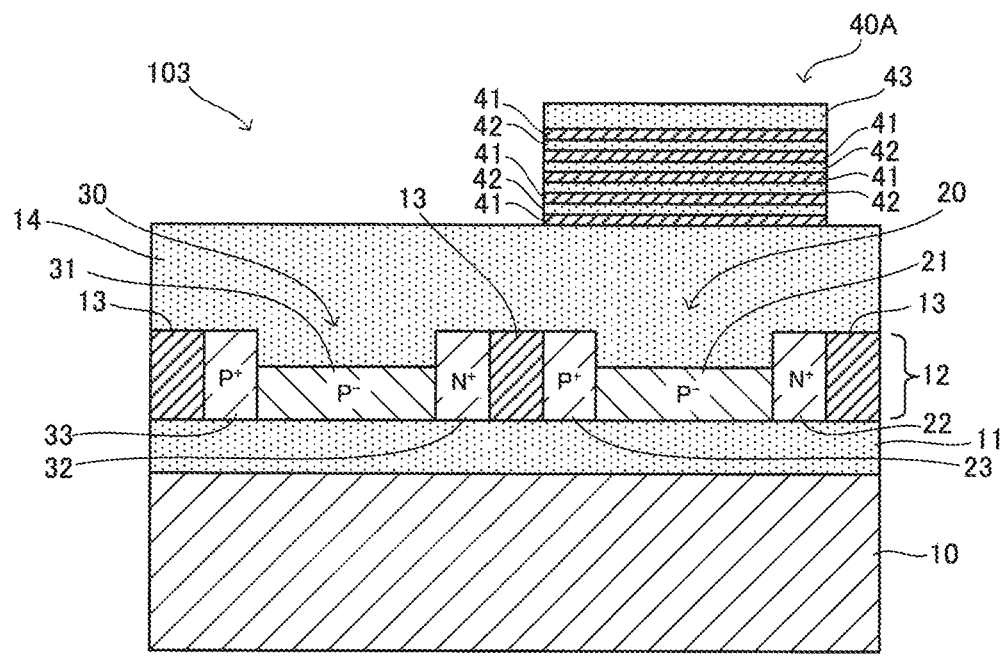
FIG. 15 is a cross-section illustrating configuration of a semiconductor device according to another exemplary embodiment of the present disclosure.

FIG. 15 is a cross-section illustrating a configuration of a semiconductor device 103 according to a fourth exemplary embodiment of the present disclosure. The configuration of a filter film 40A provided to the light incidence side of the first photodiode 20 in semiconductor device 103 according to the fourth exemplary embodiment differs from the configuration of the filter film 40 provided to the semiconductor device 100 according to the first exemplary embodiment of the present disclosure as described above. Namely, the filter film 40A differs from the filter film 40 provided to the semiconductor device 100 according to the first exemplary embodiment described above in that it further includes a thick film layer 43 that is thicker than the layer thicknesses of the high refractive index layers 41 and the low refractive index layers 42.

The thick film layer 43 preferably has a layer thickness that is from approximately 2 to approximately 2.5 times the layer thicknesses of the high refractive index layers 41 and the low refractive index layers 42. For example, in a case in which the layer thickness of the high refractive index layers 41 is approximately 45 nm, and the layer thickness of the low refractive index layers 42 is approximately 40 nm, the thickness of the thick film layer 43 may be set to approximately 100 nm, for example.

The thick film layer 43 preferably has the same refractive index as the low refractive index layers 42. Namely, the thick film layer 43 may be formed from the same silicon oxide film ($SiO_2$) as the low refractive index layers 42. The thick film layer 43 is also preferably disposed at the uppermost portion of the filter film 40A (namely, a light incidence side end portion).

The filter film 40A configured as above is wavelength selective, transmitting UV-A waves with a higher transmittance than UV-B waves, similarly to the filter film 40 according to the first exemplary embodiment. Providing the thick film layer 43 to the filter film 40A enables the ability to transmit UV-A waves to be improved compared to the filter film 40 according to the first exemplary embodiment not provided with the thick film layer 43.

Figure 16A:
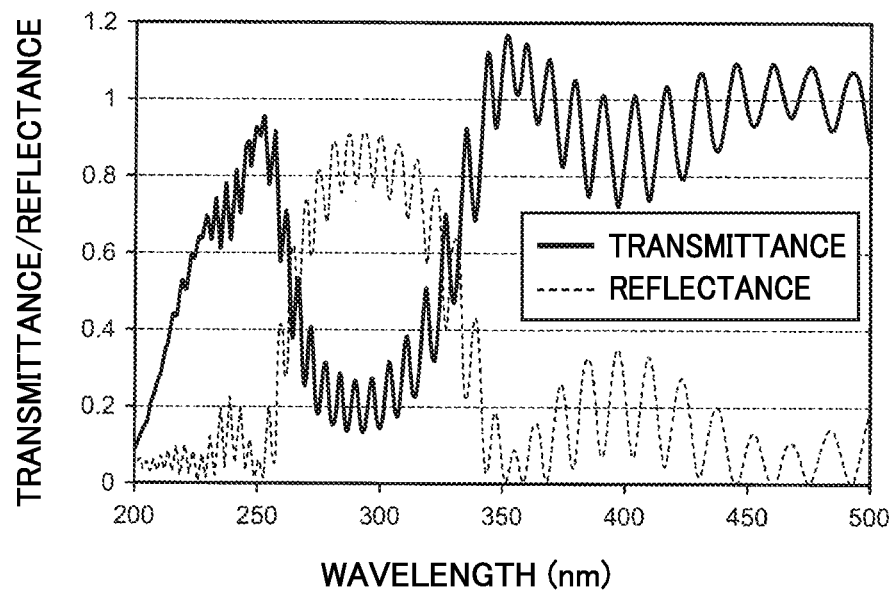
FIG. 16A is a graph illustrating results from a simulation of transmittance-wavelength characteristics and reflectance-wavelength characteristics in a filter film according to a first exemplary embodiment of the present disclosure not provided with a thick film layer.
Figure 16B:
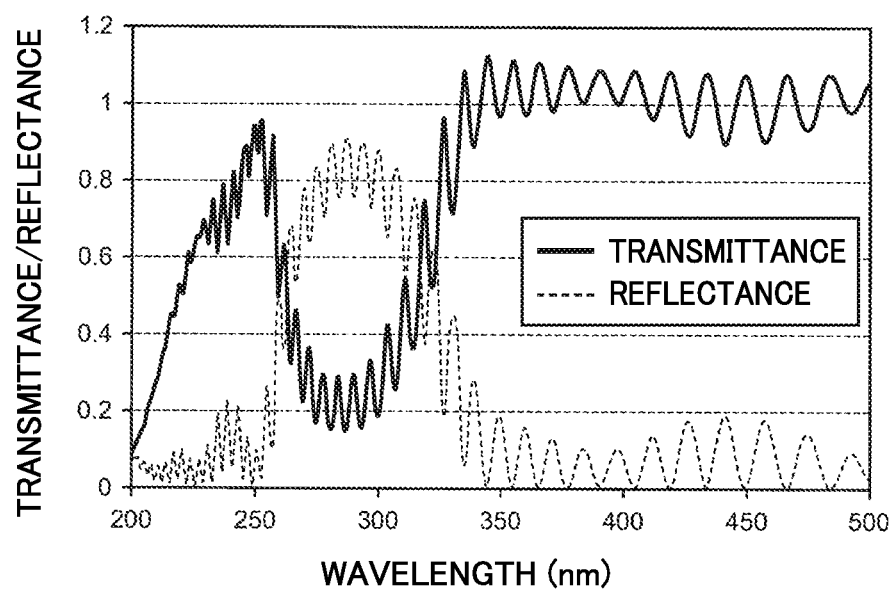
FIG. 16B is a graph illustrating results from a simulation of transmittance-wavelength characteristics and reflectance-wavelength characteristics in a filter film according to a fourth exemplary embodiment of the present disclosure provided with a thick film layer.

FIG. 16A is a graph illustrating results from a simulation of transmittance-wavelength characteristics and reflectance-wavelength characteristics in the filter film 40 according to the first exemplary embodiment not provided with a thick film layer. In contrast thereto, FIG. 16B is a graph illustrating results from a simulation of transmittance-wavelength characteristics and reflectance-wavelength characteristics in the filter film 40A according to the fourth exemplary embodiment provided with the thick film layer 43. In the cases of both FIG. 16A and FIG. 16B, the layer thickness of the high refractive index layers 41 was set to 45 nm, the layer thickness of the low refractive index layers 42 was set to 40 nm, the refractive index of the high refractive index layers 41 was set to 1.8, and the refractive index of the low refractive index layers 42 was set to 1.4. Additionally, the layer thickness of the thick film layer 43 was set to 100 nm, and the refractive index of the thick film layer 43 was set to 1.4, the same as that of the low refractive index layers 42. The thick film layer 43 is also disposed at the uppermost portion of the filter film 40A (the light incidence side end portion).

As illustrated in FIG. 16A, in to the filter film 40 not provided with a thick film layer, transmittance in the vicinity of the 400 nm wavelength, this being the UV-A wave wavelength region, is reduced, and reflectance in this wavelength region is at least 0.3. In contrast thereto, as illustrated in FIG. 16B, in to the filter film 40A provided with the thick film layer 43, transmittance in the vicinity of the 400 nm wavelength, this being the UV-A wave wavelength region, is not reduced, and reflectance in this wavelength region is suppressed to 0.1 or less.

The filter film 40A having the thick film layer 43 can improve the ability to transmit UV-A waves, compared to the filter film 40 not provided with the thick film layer 43. Note that as the UV-B wave component $I_{UVB}$ of the UV index is calculated from the difference between the output of the second photodiode 30 and the output of the first photodiode 20, as described above, and there is preferably no difference in sensitivity toward UV-A waves between the first photodiode 20 and the second photodiode 30. The filter film 40A having the thick film layer 43 can decrease the difference in sensitivity toward UV-A waves between the first photodiode 20 and the second photodiode 30, and the UV index can be calculated more accurately.

What is claimed is:

1. A semiconductor device comprising:
a pair of photoelectric transducers that output photocurrents that correspond to an intensity of received light;
an element isolator that surrounds each of the pair of photoelectric transducers;
a first filter film that is provided at a light incidence side of one of the pair of photoelectric transducers, that is configured by alternatingly stacking high refractive index layers and low refractive index layers having mutually different refractive indexes, and that transmits one of either UV-A waves or UV-B waves included in ultraviolet rays with a higher transmittance than an other of the UV-A waves and the UV-B waves; and
an insulator layer that has a lower face contacting the pair of photoelectric transducers and the element isolator, and an upper face opposing the lower face, the insulator layer covering faces of the pair of photoelectric transducers and the element isolator,
wherein a region of the upper face, corresponding to the light incidence side of an other of the pair of photoelectric transducers, is configured to be exposed.

2. The semiconductor device of claim 1, wherein the equations $\lambda_1/(4 \cdot n_1) \leq d_1 \leq \lambda_2/(4 \cdot n_1)$, and $\lambda_1/(4 \cdot n_2) \leq d_2 \leq \lambda_2/(4 \cdot n_2)$ are satisfied, where $n_1$ is the refractive index of the high refractive index layers, $d_1$ is a layer thickness of the high refractive index layers, $n_2$ is a refractive index of the low refractive index layers, $d_2$ is a layer thickness of the low refractive index layers, and a range of wavelengths $\lambda$ for which the first filter film has a lower transmittance, from out of the UV-A waves or the UV-B waves, is $\lambda_1 \leq \lambda \leq \lambda_2$.

3. The semiconductor device of claim 1, wherein a difference between refractive indexes of the low refractive index layers and the high refractive index layers is 0.4 or greater, and the refractive index of the high refractive index layers is 2 or less.

4. The semiconductor device of claim 1, wherein the first filter film further includes a thick film layer that has a same refractive index as one of either the high refractive index layers or the low refractive index layers, and that is thicker than layer thicknesses of the high refractive index layers and the low refractive index layers.

5. The semiconductor device of claim 4, wherein the thick film layer is disposed at an uppermost portion of the first filter film.

6. The semiconductor device of claim 4, wherein the thick film layer has the same refractive index as the low refractive index layers.

7. The semiconductor device of claim 1, wherein the low refractive index layers include a silicon oxide film, and the high refractive index layers include a silicon nitride film.

8. The semiconductor device of claim 1, wherein a thickness of respective light receiving regions of the pair of photoelectric transducers is 36 nm or less.

9. The semiconductor device of claim 1, wherein side faces of the first filter film are covered by a light-shielding film that blocks ultraviolet rays.

10. The semiconductor device of claim 1, wherein the other of the pair of photoelectric transducers receives both the UV-A waves and the UV-B waves.

11. The semiconductor device of claim 1, further comprising:
a calculation section configured to calculate an index value representing an intensity of received ultraviolet rays based on photocurrent output from the one of the pair of photoelectric transducers and photocurrent output from the other of the pair of photoelectric transducers.

12. The semiconductor device of claim 11, wherein the calculation section is configured to calculate, as the index value, a summed value of a first value that corresponds to an intensity of the UV-A waves and a second value that corresponds to an intensity of the UV-B waves.

13. A semiconductor device manufacturing method comprising:
- a process of forming a pair of photoelectric transducers on a semiconductor layer;
- a process of forming an element isolator that surrounds each of the pair of photoelectric transducers;
- a process of forming, on a light incidence side of one of the pair of photoelectric transducers, a first filter film that is configured by alternatingly stacking high refractive index layers and low refractive index layers having mutually different refractive indexes, and that transmits one of either UV-A waves or UV-B waves with a higher transmittance than an other of the UV-A waves and the UV-B waves; and
- a process of forming an insulator layer that has a lower face contacting the pair of photoelectric transducers and the element isolator, and an upper face opposing the lower face, the insulator layer covering faces of the pair of photoelectric transducers and the element isolator, wherein a region of the upper face, corresponding to the light incidence side of an other of the pair of photoelectric transducers, is configured to be exposed.

14. A semiconductor device comprising:
a pair of photoelectric transducers that output photocurrents that correspond to an intensity of received light;
a first filter film that is provided at a light incidence side of one of the pair of photoelectric transducers, that is configured by alternatingly stacking high refractive index layers and low refractive index layers having mutually different refractive indexes, and that transmits UV-A waves included in ultraviolet rays with a higher transmittance than UV-B waves; and
a second filter film that is provided at a light incidence side of an other of the pair of photoelectric transducers, that is configured by alternatingly stacking second high refractive index layers and second low refractive index layers having mutually different refractive indexes, and that transmits the UV-B waves with a higher transmittance than the UV-A waves.

* * * * *